(12) United States Patent
Gruen et al.

(10) Patent No.: US 6,447,851 B1
(45) Date of Patent: *Sep. 10, 2002

(54) FIELD EMISSION FROM BIAS-GROWN DIAMOND THIN FILMS IN A MICROWAVE PLASMA

(75) Inventors: Dieter M. Gruen, Downers Grove, IL (US); Alan R. Krauss, Naperville, IL (US); Ming Q. Ding, Beijing (CN); Orlando Auciello, Bolinbrook, IL (US)

(73) Assignee: The University of Chicago, Chicago, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/352,063

(22) Filed: Jul. 14, 1999

(51) Int. Cl.⁷ .................................................. H05H 1/24
(52) U.S. Cl. .................... 427/575; 427/577; 427/904
(58) Field of Search ............................. 427/577, 249.7, 427/249.8, 902, 904, 249.12, 575

(56) References Cited

U.S. PATENT DOCUMENTS

| | | | |
|---|---|---|---|
| 4,869,923 A | * 9/1989 | Yamazaki | 427/122 |
| 5,283,087 A | * 2/1994 | Yamazaki et al. | 427/577 |
| 5,427,827 A | * 6/1995 | Shing et al. | 427/577 |
| 5,439,753 A | * 8/1995 | Rogers | 427/577 |
| 5,580,380 A | * 12/1996 | Liu et al. | 427/577 |
| 5,857,882 A | * 1/1999 | Pam et al. | 427/540 |

FOREIGN PATENT DOCUMENTS

JP  02-225671  * 9/1990

OTHER PUBLICATIONS

Bougdira Et Al, Thin Solid Film 325 pp. 7–13, 1998.*

* cited by examiner

*Primary Examiner*—Bret Chen
(74) *Attorney, Agent, or Firm*—Emrich & Dithmar

(57) ABSTRACT

A method of producing diamond or diamond like films in which a negative bias is established on a substrate with an electrically conductive surface in a microwave plasma chemical vapor deposition system. The atmosphere that is subjected to microwave energy includes a source of carbon, nitrogen and hydrogen. The negative bias is maintained on the substrate through both the nucleation and growth phase of the film until the film is continuous. Biases between –100V and –200 are preferred. Carbon sources may be one or more of $CH_4$, $C_2H_2$ other hydrocarbons and fullerenes.

14 Claims, 11 Drawing Sheets

FIELD EMISSION FROM BIAS-GROWN DIAMOND THIN FILMS IN A MICROWAVE PLASMA

CONTRACTUAL OF THE INVENTION

The United States Government has rights in this invention pursuant to Contract No. W-31-109-ENG-38 between the U.S. Department of Energy and The University of Chicago representing Argonne National Laboratory.

TECHNICAL FIELD

This invention relates to a novel method of depositing diamond or diamond-like substances in a microwave plasma chemical vapor deposition system to produce a film having superior field emission properties.

BACKGROUND OF THE INVENTION

Diamond and diamond-like carbon (DLC) thin films have recently attracted much attention due to their potential applications in vacuum microelectronics. Apart from their excellent properties such as good thermal conductivity, chemical inertness and high breakdown electric field, diamond and DLC thin films have been found to have excellent field electron emitting properties. It has been suggested that it is possible to use a form of amorphous carbon known as "amorphic diamond" as a planar cold cathode in a novel form of field emission display (FED), which is much simpler and cheaper than the metal or Si tip arrays commonly used as large area cold cathodes. The direct use of diamond or DLC films as planar cathodes, however, has been hindered by poor uniformity of field emission from these films. This has led to extensive studies into diamond and DLC thin film processing methods and attempts to understand field emission mechanisms of these films.

It is known that diamond nucleation density in a Carbon Vapor Deposition (CVD) growth environment can be enhanced by a bias induced nucleation method. This process involves applying a negative or positive voltage to the substrate in a $CH_4/H_2$ plasma, where positive ions or electrons are attracted towards the substrate surface. The interaction between ions or electrons and the surface is believed to create active sites for nucleation. It is known that a negative bias has a number of effects on the nucleation process, such as a) acceleration of migration and carbonization reaction, b) transition from $sp^2$ carbon bonds to $sp^3$ bonds and c) sub implantation of ions.

SUMMARY OF THE INVENTION

Recently, it was reported that (001) textured diamond films can be deposited on a (111) surface using a proper negative bias during nucleation. However, our invention refers to films deposited where the negative bias on the substrate is maintained through the entire growth phase, resulting in superior field emissioni characteristics. Ion bombardment has been widely used to modify the properties of growing films, but little is known of the effect of ion bombardment with a negative substrate bias maintained during the entire time of growth on field emission properties of diamond thin films. We deposited diamond films on Si wafers under various substrate bias conditions in a $CH_4$—$N_2$—$H_2$ plasma and determined the influence of the $CH_4$ concentration and the bias (+100 V to −150 V) on field emission performance. We found that providing a negative substrate bias during the entire growth process resulted in a film with superior field emission properties as measured by turn-on field voltages of 1.5–2.0 v/$\mu$m and low work function. Accordingly, it is an important object of the present invention to provide a method of producing diamond or diamond like films comprising establishing a negative bias on a substrate with an electrically conductive surface in a microwave plasma chemical vapor deposition system with the atmosphere subjected to the microwave energy including a source of carbon, nitrogen, hydrogen and possibly Ar, maintaining the negative bias on the substrate through both the nucleation and growth phase of the film until the film is continuous.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

DETAILED DESCRIPTION OF THE INVENTION

Diamond thin films used in this study were grown on (100) surfaces of n-type Silicon wafers with a resistivity of 0.01 ohm-cm in a microwave plasma enhanced CVD system (ASTeX PDS-17). While Si wafers were used, a variety of substrates may be employed, such as a ceramic with an electrically conducting layer of metal, like Ti or Mo or W. The substrate was first polished with diamond powder with a particle size of 0.1 $\mu$m and then placed in the plasma chamber and heated to 800° C. The deposition was carried out at 600 Watts microwave power, while the chamber was maintained at 11 Torr total pressure with a gas mixture of 1%

N$_2$ and 1–20% CH$_4$ with a balance of H$_2$. The substrate was biased at a given voltage ranging from +100 V to −150 V. The film thickness was around 0.6 μm (6,000 Å) as monitored by a laser interferometer. N$_2$ acts as a dopant in the deposited film. CH$_4$ was used as a carbon source by way of illustration, but C$_2$H$_2$ or other hydrocarbons as well as fullerenes may be used. Concentrations of CH$_4$ have to be divided by 2 if acetylene (C$_2$H$_2$) is used and by 60 if fullerenes are used.

The field emission properties of the films were determined in a field emission testing system. The anode was a stainless steel rod 1.89 mm in diameter and was flat except for a slight rounding at the corners to eliminate sharp edges. The gap between the anode and the cathode (sample) was computer controlled via a micro-stepping motor and was measured by an optical microscope attached to a CCD camera and a TV monitor. The chacteristics of the emission current vs applied voltage were then obtained by increasing the applied voltage from 0 to 3 KV and then decreasing to zero, with a series of increasing gap distances usually from 50 to 200 μm. The emission current was converted to a 0–10 volt signal by a Keithley electrometer that was typically operated to provide a maximum output voltage for an emission current of 10 μA. The measurements were carried out under a low 10$^{-8}$ Torr vacuum. The reported electric field values were calculated by dividing the applied voltage by the anode-cathode distance, assuming no local enhancement of the field by topographic asperities.

Morphology and structure of the films were studied by a Hitachi S-4500 microscope scanning electron microscope (SEM) and a UV Raman spectroscopy system.

It is known that "pure" or high quality diamond does not field-emit well, and that CH$_4$ concentration in a CVD plasma is one of the important parameters that determines the quality of the diamond film. We first determined the effect of CH$_4$ concentration on field emission of the films grown under a bias condition. All the films in this set of samples were grown with a substrate bias of −100 V in a gas mixture of 1% N$_2$, 1–20% by volume CH$_4$ and a balance of H$_2$. The current-field measurements were made at more than 5 sites per sample, and at each site several sets of I vs E data were collected.

Figure 1:
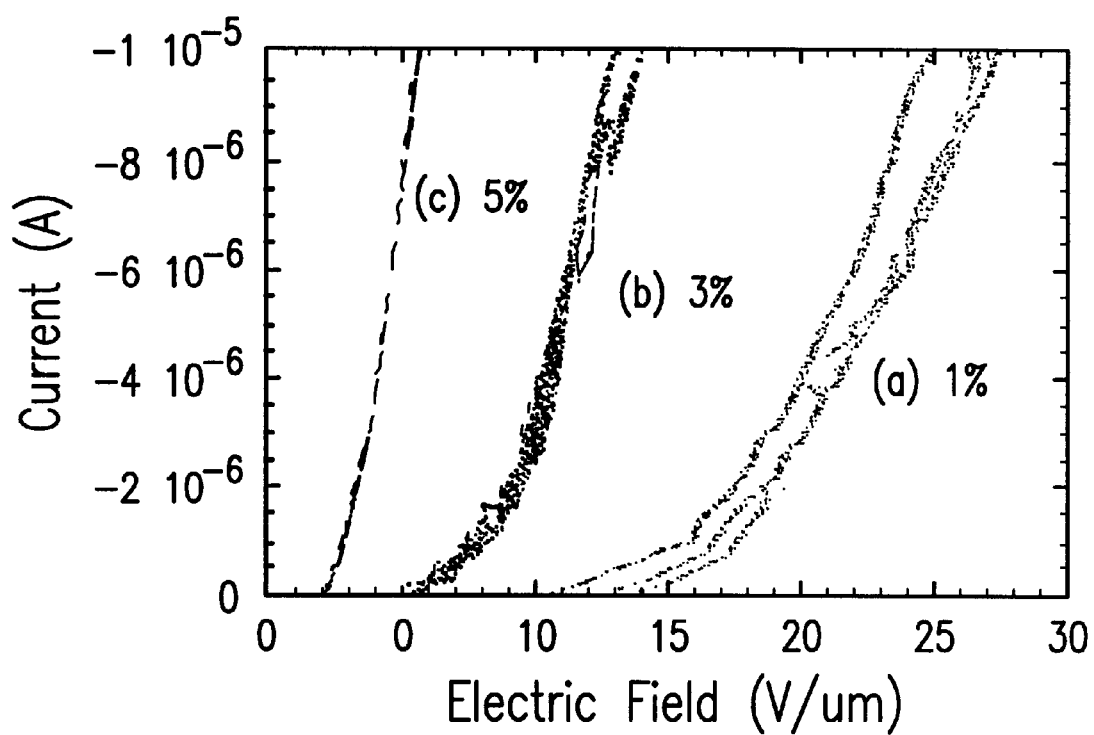
FIG. 1 is a graphical representation of a current-electric field (I-E) curves taken from the films grown with −100 V with the following CH4 concentrations: (a) 1%, (b) 3%, and (C) 5%.
Figure 2:
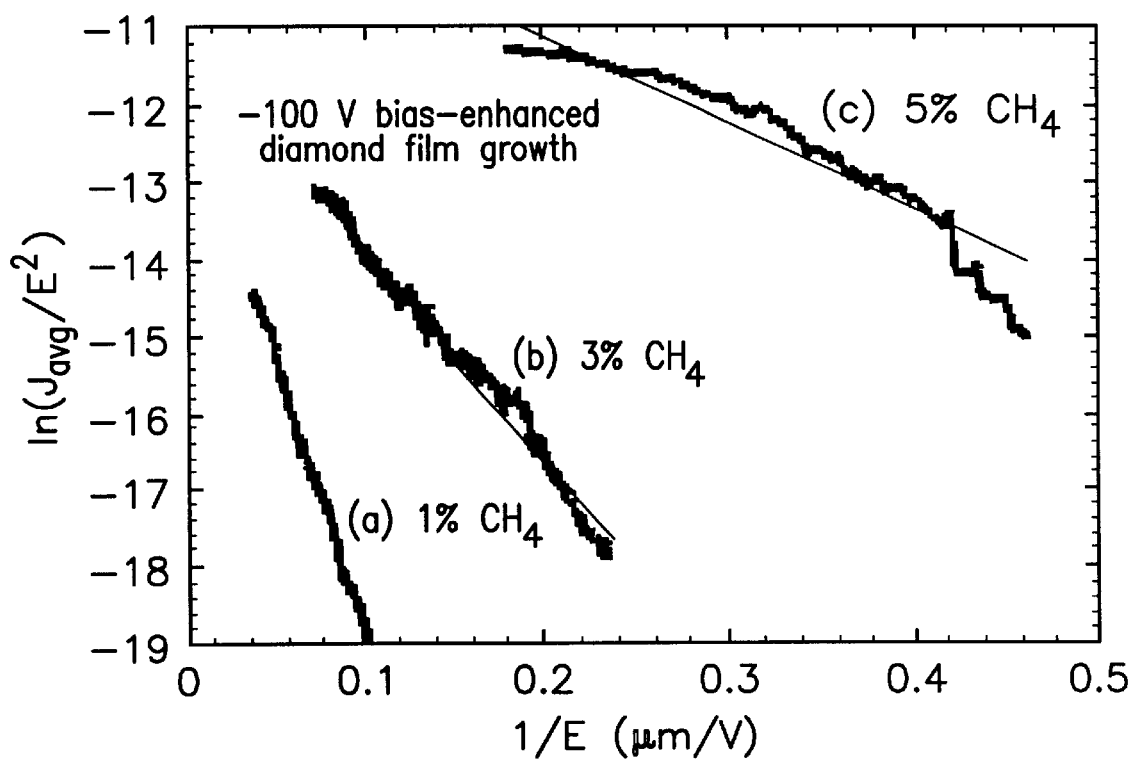
FIG. 2 is a graphical representation of Fowler-Nordheim plots, with data converted from one of each set of I-E curves in FIG. 1: (a) 1% $CH_4$, (b) 3% $CH_4$, and (C) 5% $CH_4$.

FIG. 1 shows three typical sets of I-E data obtained from the films grown at the following CH$_4$ concentrations: (a) 1%, (b) 3%, and (c) 5%. Note that each set of data contains four curves (two up scans and two down scans), with the x-axis plotted as electric field. It can be clearly seen that the I-E curves shift towards low electric field and the current signal becomes less noisy as the CH$_4$ concentration increases from 1% to 5%. The I-E curves were interpreted by Fowler-Nordheim equation given by:

$$J = 154 F^2 / \emptyset \exp(-6830 \emptyset^{3/2} / F)$$

with F=βV/d,
where,
J is the current density (Amps/cm2), F is the electric field (Volts/μm), β is the geometric field enhancement factor, Ø is the work function (eV), and d is the distance (μm) between the anode and the cathode in a planar diode structure. One of the four curves (the smoothest one) in each set shown in FIG. 1 was converted into Fowler-Nordheim plots, shown in FIG. 2. From these plots, each set of data points was fitted approximately into a straight line corresponding to tunneling electron emission. These three lines exhibit very distinct slopes and intercepts with the Log (I/V$^2$) axis. Assuming the field enhancement factor to be unity, the effective work function is calculated to be 0.027, 0.032, and 0.064 eV for the films grown at 5%, 3%, and 1% CH$_4$, respectively, showing that higher carbon concentrations produced lower effective work functions.

Figure 3:
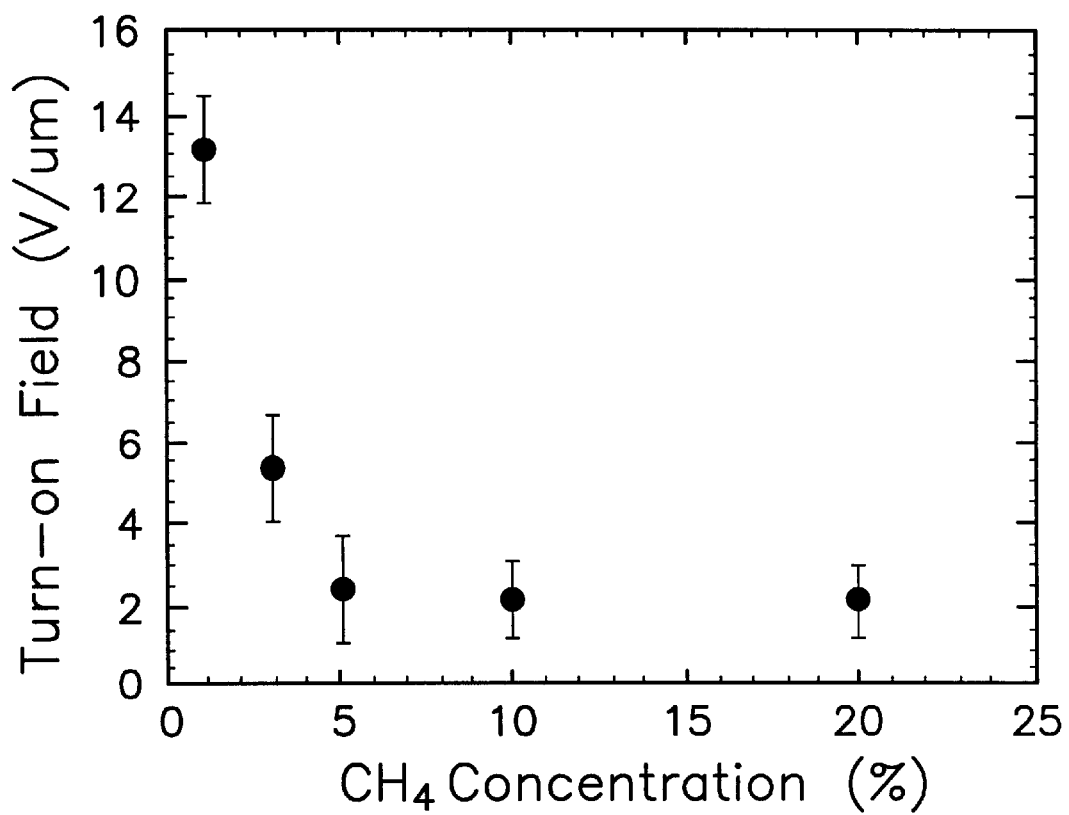
FIG. 3 is a graphical representation of the turn-on field plotted as a function of $CH_4$ concentration with the films grown with a bias −100 V in a gas mixture of $CH_4$, 1% $N_2$, and a balance of $H_2$.

To explore the effect of CH$_4$ concentrations on field emission properties, the turn-on field (the field required to attain an emission current of 1×10$^{-7}$ A) was plotted as a function of CH$_4$ concentration, as shown in FIG. 3. These data were obtained by averaging measurements on at least five sites of each sample, with the error bar representing the standard deviation in the measurement of a sample. Apparently, the turn-on field drops drastically with the increasing CH$_4$ concentrations in a low CH$_4$ range (1–5%), whereas above 5% CH$_4$, it approaches a constant value of about 2 V/μm. Such field emission behavior is generally in agreement with known observations. However, the turn-on fields with the inventive films are lower than those previously reported. We believe that the negative bias and the addition of nitrogen in the plasma play an important role in promoting field emission. The deviation in the measured field threshold becomes small as the CH$_4$ concentration increases, which may result from an increase in emission site density.

It is believed that the inclusion of graphite particles or sp$^2$ bonded carbon atoms in diamond or DLC films promotes field emission from diamond and amorphous diamond films.

Figure 4:
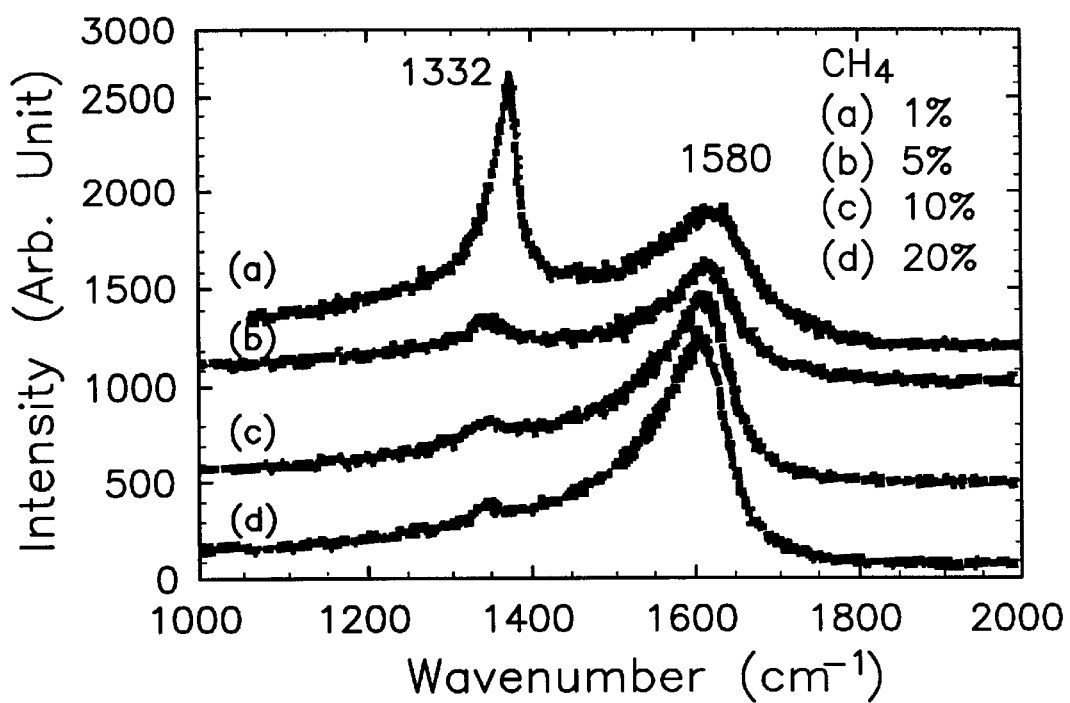
FIG. 4 is a graphical representation of a UV Raman spectum taken from the films grown at −100 V with the following $CH_4$ concentrations: (a) 1%, (b) 5%, (C) 10%, and (d) 20%.

To gain some insight into the above field emission behavior, the bonding structure of these films was studied using UV Raman spectroscopy. FIG. 4 shows the Raman spectra taken from the films grown with (a) 1%, (b) 5%, (c) 10%, and (d): 20% CH$_4$. All these spectra exhibit two major features. One peak at wave number 1332 cm$^{-1}$ results from diamond or sp$^3$ bonding. The other feature at 1580 cm$^{-1}$ is attributed to sp$^2$ bonded carbon. As the CH$_4$ concentration increases, the diamond peak intensity decreases, accompanied by an increase in the sp$^2$ carbon peak intensity. The initial decrease in the sp$^3$ carbon peak intensity with the increase in CH$_4$ concentration (from 1% to 5%), correlates with the decrease in the turn-on field shown in FIG. 3. However, the sp$^3$ peak remains constant for CH$_4$ content 25%, and the sp$_2$ peak continues to grow as the CH$_4$ content increases, while the emission threshold does not change. This confirms that the field emission properties are closely associated with the content of both the sp$^2$ and sp$^3$ bonded carbon in diamond or DLC films. Meanwhile, the broadening of the diamond peak with the increasing CH$_4$ concentration is also correlated with the lowered field emission threshold. Above 5% CH$_4$ concentration, however, the width of the diamond peak does not show significant change.

Figure 5:
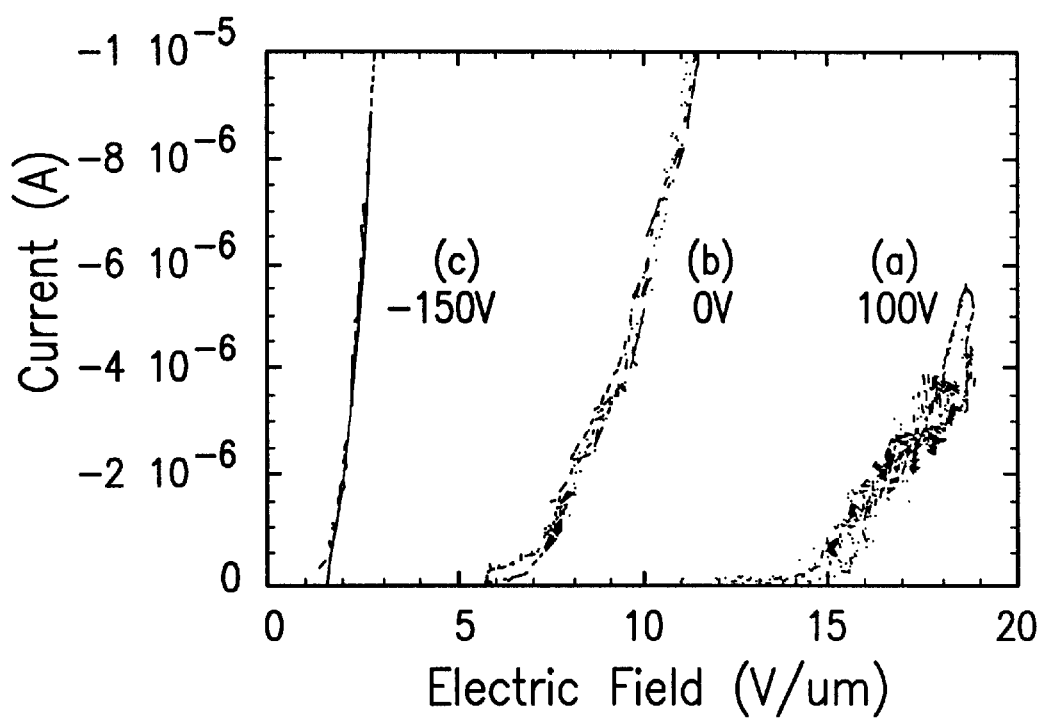
FIG. 5 is a graphical representation of a current-electric field (I-E) curves taken from the films grown in a gas mixture of 10% $CH_4$ and 1% $N_2$ with a balance of $H_2$ at a bias of: (a) +100 V, b) 0 V, and (C) −150 V.
Figure 6:
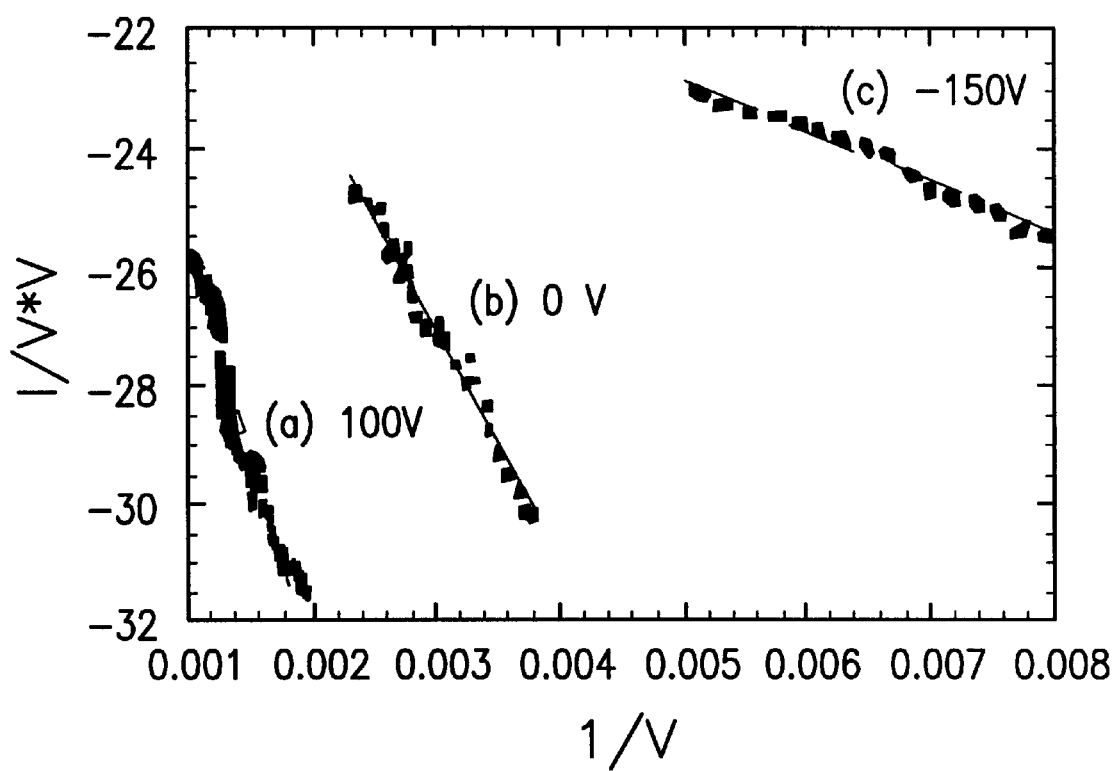
FIG. 6 is a graphical representation of Fowler-Nordheim plots with data from one of each set of I-E curves in FIG. 5: (a) +100 V, (b) 0 V, and (C) −150 V.

To examine the effect of bias during film growth on field emission, a voltage ranging from +100 V to −150 V was applied to the substrate, while the growth conditions were kept as follows: substrate temperature of 800° C., microwave power of 600 W, gas mixture of 10% CH$_4$, 1% N$_2$ and 80% H$_2$ at a total pressure of 11 Torr. FIG. 5 shows three typical sets of I-E curves. These three sets of data were obtained from the films grown under biases of (a) +100 V, (b) 0 V, and (c) −150 V. Each set has four curves (two up scans and two down scans). The onset field decreases as the bias varies from +100 V to −150 V. The data show the lowest turn-on field of 1.5 V/μm at a bias of −150 V, and the current has the lowest noise level. FIG. 5 displays the Fowler-Nordheim plots of these films. From the plots, the effective work function was calculated to be 0.019, 0.048, and 0.073 eV for the films grown at −150 V, 0 V, and +100 V, respectively, assuming β is unity. Negative voltages in the range just less than zero to −200 V are useful, but voltages in the range of from about −100 to about −200 V are preferred and in the range of from about −150V to about −200 V are most preferred.

Figure 7:
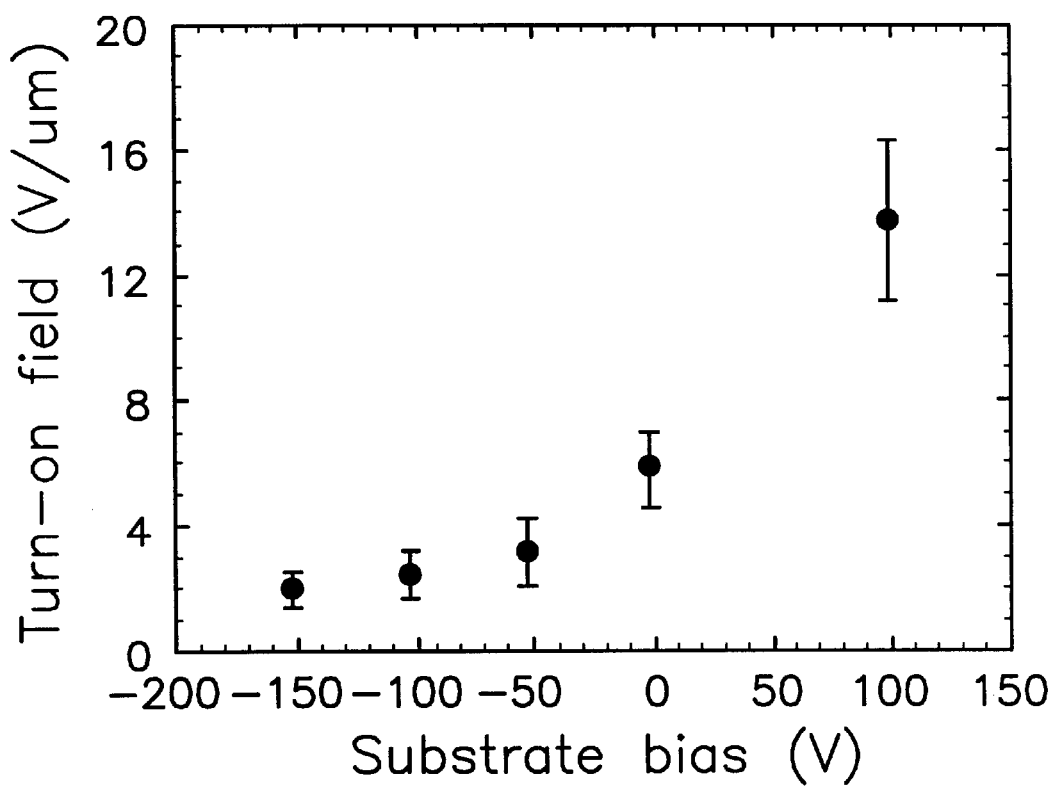
FIG. 7 is a graphical representation of a turn-on field vs substrate bias with the films grown in 10% $CH_4$—1%$N_2$—89$H_2$ plasma.
Figure 8:
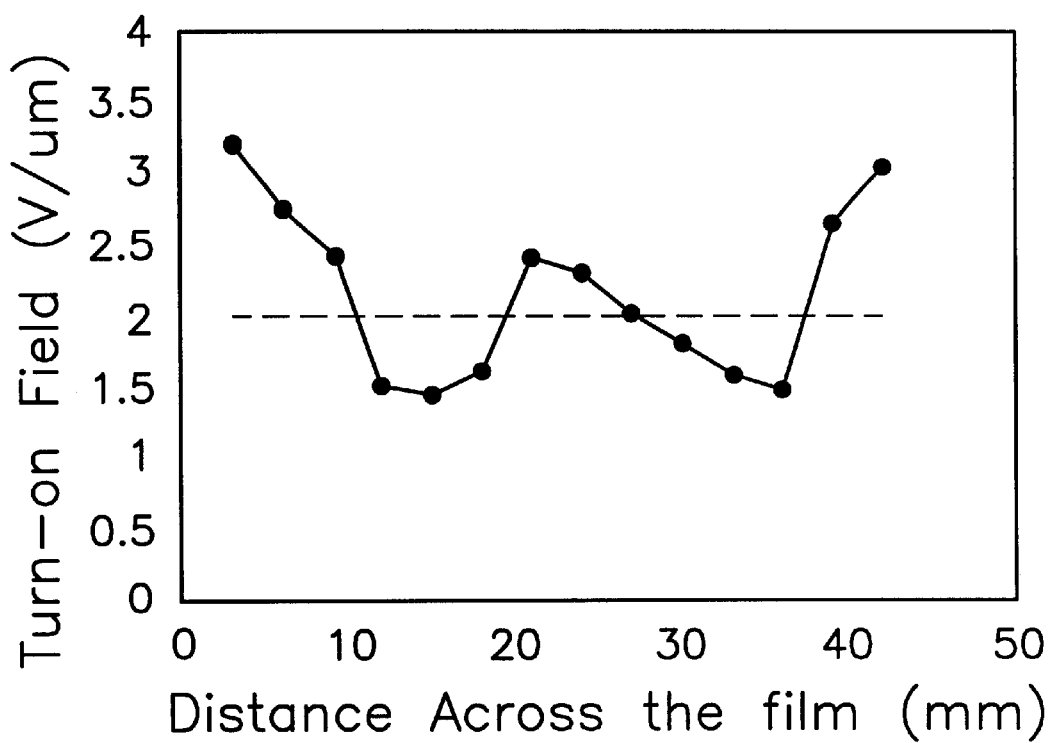
FIG. 8 is a graphical representation of a turn-on field vs distance across the film grown in 10% $CH_4$—1%$N_2$—89%$H_2$ plasma at a bias of −150 V.

The effect of the bias on the field emission is shown from the turn-on field vs. substrate bias, as shown in FIG. 7. As the bias varies from positive voltage to negative voltage, the turn-on field drops rapidly and then slowly decreases. Again, the error bars show a decreasing deviation in the measured turn-on field as the absolute value of the negative bias increases, which may be a result of an increase in the density of emission sites. These observations show that a negative bias during growth promotes low-field cathode electron emission. The film grown at the bias of −150 V was tested over a length of 40 mm for 14 measurements, and exhibits a relatively uniform turn-on field of 2±0.55 /$\mu$m, as shown in FIG. 8. The behavior was reproducible in other films.

Figure 9:
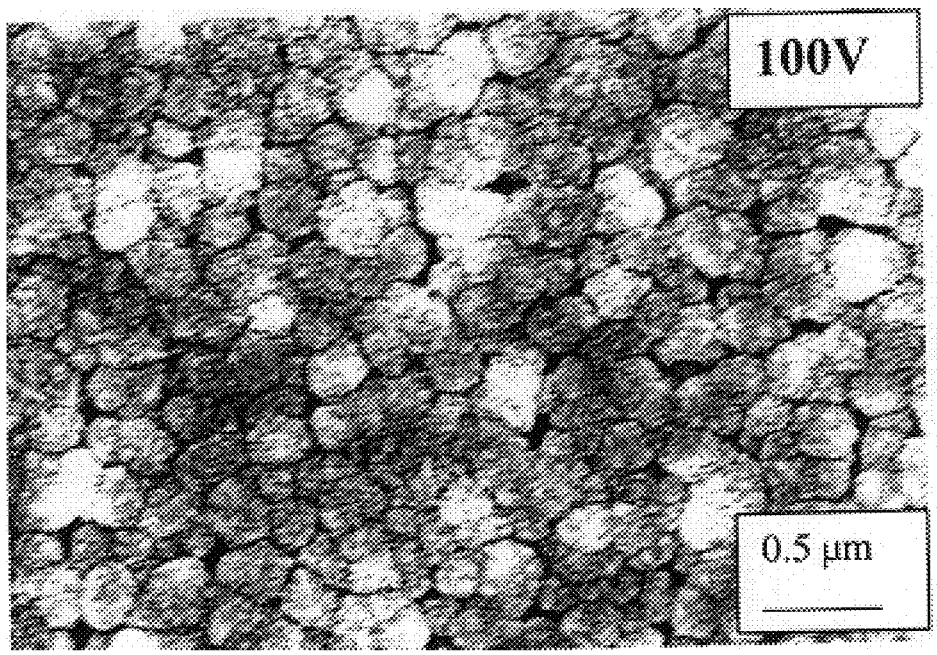
FIG. 9 is a graphical representation of SEM images of the films grown in 10%$CH_4$—1%$N_2$—89%$H_2$ plasma with biases; (a) +100 V, (b) 0 V, and (C) −150 V.
Figure 9:
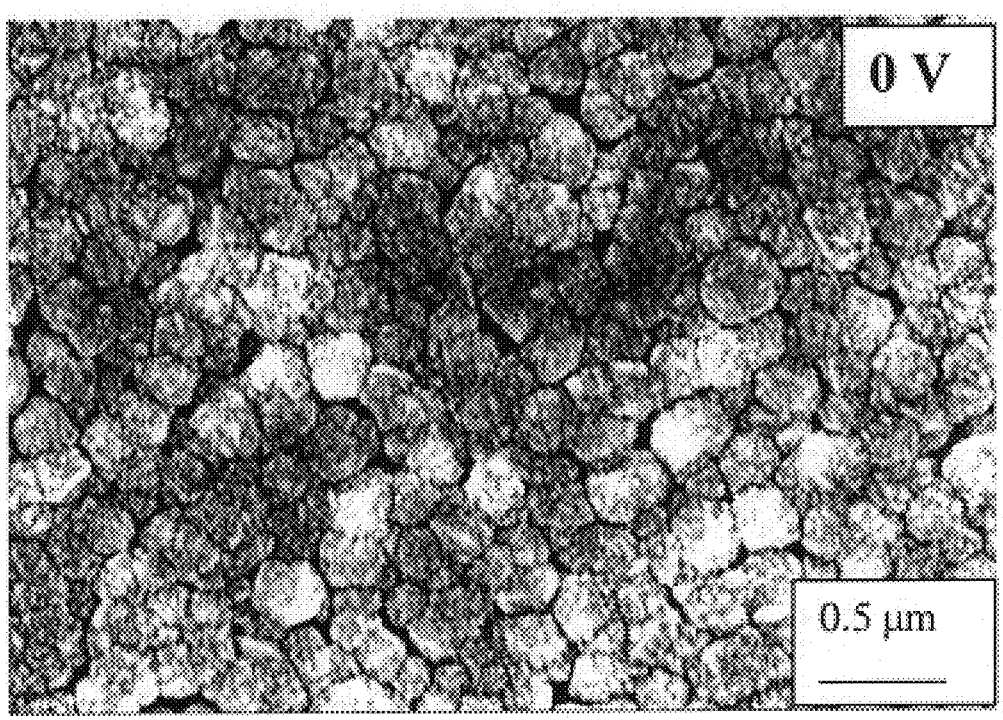
Figure 9:
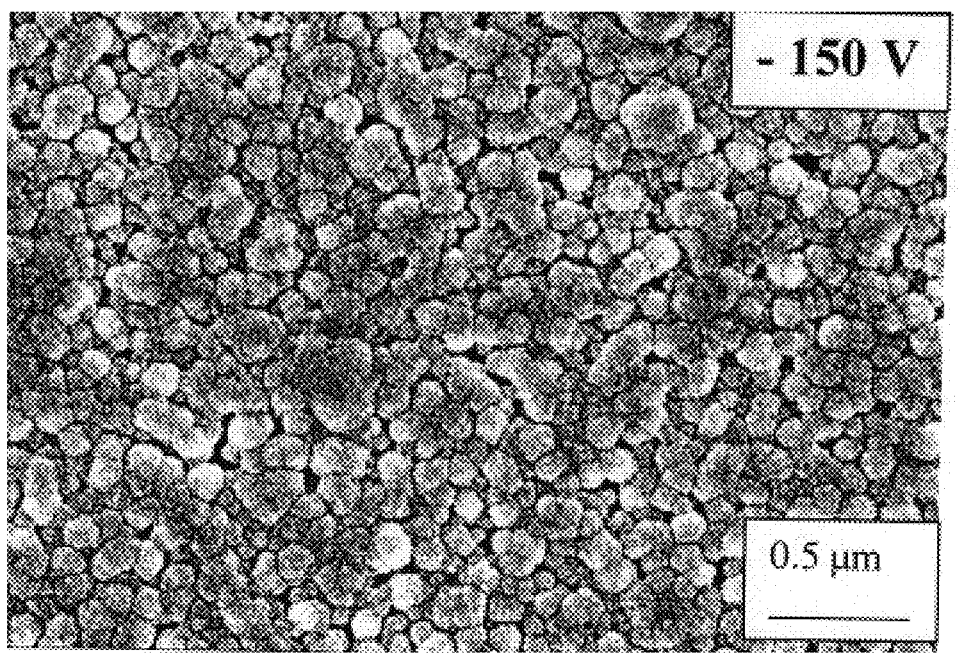

The morphology of the films was studied using high resolution SEM. FIG. 9 displays the SEM images of the films grown with biases: (a) +100 V, (b) 0 V, and (c) −150 V. Although all these films are very smooth, the film grown at −150 V shows some noticeable differences. First, the particle size of the film is slightly smaller than the films grown at 0 V and +100 V biases. Second, the particles of the film seem to coalesce together. These differences possibly result from re-nucleation under ion bombardment during the growth. The films grown at biases of +100 V and 0V look similar to each other.

It is well known that the interaction of ions with the surface of a growing film may result in a number of effects, which in turn affect the properties of the film or the surface. Negative biases during diamond growth have been found to alter the orientation of the diamond film. As mentioned previously, (001) textured diamond films can be deposited on a (111) surface using a negative bias. Improved field emission for Ar ion irradiated carbon with tens of Kilo-volt ions has been reported. Until our invention, it has been unclear how the bias growth affects field emission. We believe that the increased defect density of the films grown under the negative bias may be responsible; for the enhancement in the field emission properties.

A defect model has been proposed as a mechanism of field emission from synthesized diamond films. In this model, it was suggested that diamond films contain a number of structural defects which may form bands within the diamond band gap from which electrons can tunnel through the surface barrier into the vacuum. Carbon ion implantation into diamond films was also reported to induce defects resulting in a field emission enhancement. It is, therefore, expected that the improvement in the field emission properties of the negative bias-grown films may be associated with additional ion induced defects during the film growth. As the absolute value of the negative voltage increases, the defect density also increases due to the increased kinetic energy and flux of ions such as $C^+$. This may explain the enhanced field emission behavior shown in FIG. 7.

Electron bombardment has been reported to enhance nucleation via defects created in a positive bias condition. Field emission from the film grown at a bias of 100 V, however, is relatively poor. One possible reason for this may be associated with a doping effect. Based on a defect-induced stabilization model for diamond growth, it has been suggested that it is easier to grow p-type diamond films under electron-rich conditions, whereas it is easier to grow n-type diamond films under positive ion bombardment. This is because under electron (ion) bombardment, the Fermi energy of the diamond film shifts toward the conduction (valence) band, which leads to a lowered energy of incorporation of n-(p-) type dopants. Nitrogen substitution in diamond is known to be n-type with a deep level 1.7 eV below the conduction band minimum, although it has been extremely difficult to develop a process which leads to substitutional doping in CVD diamond. However, it seems that ion beam damage in general results in effective n-type behavior since even carbon sub-implantation in diamond results in n-type behavior. Studies show that carbon ion sub-implantation and nitrogen substitution in diamond result in more defects in the film.

From the above it is believed that ion bombardment under a negative bias has three effects on the film: one is to increase the density of defects (including $sp^2$ bonded carbon) in the diamond film, another is to promote N incorporation and carbon ion-sub-implantation, and a third effect is to change the morphology of the film. These effects may contribute to the improvement of the field emission properties.

We have investigated field emission properties from bias grown diamond thin films in a $CH_4$—$N_2$—$H_2$ plasma. Field emission performance of the film grown at a substrate bias of −100 V has been found to be considerably improved as $CH_4$ concentration increases from 1 to 5%, which is ascribed to a decrease in $sp^3$ carbon as verified from the Raman spectra. For the films grown under a bias of +100 V to −150V in a gas mixture of 10% $CH_4$, 1% $N_2$ and a balance of $H_2$, the turn-on field and the deviation in the measured threshold field decreased as the negative bias voltage increased. At a bias of −150 V, the lowest turn-on field of −1.5 V/$\mu$m was achieved, and 14 I-E measurements over a length of 40 mm across the sample showed a relatively uniform turn-on of 2.0±0.55 V/$\mu$m. On the other hand, the film grown at a positive bias had relatively poor field emission properties. We have demonstrated that the field emission performance of the CVD diamond films can be substantially improved by applying a negative bias to the substrate during the growth.

While there has been disclosed what is considered to be the preferred embodiment of the present invention, it is understood that various changes in the details may be made without departing from the spirit, or sacrificing any of the advantages of the present invention.

The embodiments of the invention in which an exclusive property or privilege is claimed are defined as follows:

1. A method of producing diamond or diamond like films for electron field emission applications comprising establishing a negative bias on a substrate with an electrically conductive surface in a microwave plasma chemical vapor deposition system with the atmosphere subjected to the microwave energy including a source of carbon present at a concentration greater than 5% by volume based in $CH_4$, nitrogen and hydrogen, maintaining the negative bias on the substrate through both the nucleation and growth phase of the film until the film is continuous, thereby to produce a film having a reduced electron field emission turn on voltage and a substantially uniform emitting area.

2. The method of claim 1, wherein the negative bias is maintained at not less than about −100 v during the growth phase of the film.

3. The method of claim 1, wherein the negative bias is maintained in the range of from about −100 v to about −200 v during the growth phase of the film.

4. The method of claim 1, wherein the negative bias is maintained in the range of from about −100 v to about −200 v during the nucleation and the entire growth phase of the film, thereby to produce a film having an electron field emission turn on voltage reduced by a factor of not less than 6.0/2.5.

5. The method of claim 1, wherein the microwave energy is about 600 watts.

6. The method of claim 1, wherein the nitrogen concentration is not less than about 1 volume percent.

7. The method of claim 1, wherein the nitrogen concentration is in the range of from about 1 volume percent to about 5 volume percent.

8. The method of claim 1, wherein the source of carbon is present at a concentration in the range of up to about 20 volume percent.

9. The method of claim 8, wherein the carbon source is one or more of $CH_4$, $C_2H_2$, other hydrocarbons, a fullerene or mixtures thereof.

10. The method of claim 9, wherein the source of carbon is present at a concentration in the range of from about 5 volume percent to about 20 volume percent, based on $CH_4$.

11. The method of claim 1, wherein the film is at least 2000 Å thick.

12. The method of claim 1, wherein the film is about 6000 Å thick.

13. The method of claim 1, wherein the negative bias is maintained in the range of from about −150 V to about −200 V during the nucleation and the entire growth phase of the film, thereby to produce a film having an electron field emission turn on voltage reduced by a factor of not less than about 3.

14. The method of claim 1, wherein the negative bias maintained during both the nucleation and growth phase of the film is always less than −150 V.

* * * * *

UNITED STATES PATENT AND TRADEMARK OFFICE
CERTIFICATE OF CORRECTION

PATENT NO.    : 6,447,851 B1
DATED         : September 10, 2002
INVENTOR(S)   : Dieter M. Gruen et al.

It is certified that error appears in the above-identified patent and that said Letters Patent is hereby corrected as shown below:

<u>Title page,</u>
Item [75], Inventor Orlando Auciello, delete "Bolinbrook" and insert -- Bolingbrook --.

<u>Column 5,</u>
Line 39, after the word "responsible", delete ",".

Signed and Sealed this

Eighth Day of April, 2003

JAMES E. ROGAN
*Director of the United States Patent and Trademark Office*